United States Patent [19]

Brandt

[11] Patent Number: 4,974,234

[45] Date of Patent: Nov. 27, 1990

[54] METHOD OF AND CIRCUIT FOR THE MEASUREMENT OF JITTER MODULATION OF ZERO-RELATED DIGITAL SIGNALS

[75] Inventor: Dieter Brandt, Eningen, Fed. Rep. of Germany

[73] Assignee: Wandel & Golterman GmbH & Co., Eningen, Fed. Rep. of Germany

[21] Appl. No.: 416,246

[22] Filed: Oct. 2, 1989

[30] Foreign Application Priority Data

Oct. 1, 1988 [DE] Fed. Rep. of Germany ....... 3833486

[51] Int. Cl.$^5$ .............................................. H04B 3/46
[52] U.S. Cl. ..................................... 375/10; 375/118; 328/162
[58] Field of Search .................... 375/10, 118, 99; 324/77 R, 77 D, 83 R, 83 D; 364/514, 481; 328/155, 162; 371/64

[56] References Cited

U.S. PATENT DOCUMENTS

| | | | |
|---|---|---|---|
| 3,496,536 | 2/1970 | Wheeler et al. | 375/10 |
| 3,771,059 | 11/1973 | Butler et al. | 375/10 |
| 3,916,307 | 10/1975 | Hekimian | 324/83 R |
| 3,985,955 | 10/1976 | Blass et al. | 324/83 D |
| 4,694,468 | 9/1987 | Cullum | 324/77 R |
| 4,800,571 | 1/1989 | Konishi | 364/514 |

OTHER PUBLICATIONS

Specification for Instrumentation to Measure Timing Jitter on Digital Equipment; Fascicle IV.4–Rec.0.1/1; pp. 147–155.
Halbleiter-Schaltungstechnik; U. Tietze & Ch.Schenk; Springer Verlag, Berlin, Heidelberg, New York, Tokyo 1985; 4 pages.

Primary Examiner—Benedict V. Safourek
Assistant Examiner—Stephen Chin
Attorney, Agent, or Firm—Herbert Dubno

[57] ABSTRACT

A process and circuit for measuring the jitter modulation of a digital signal in which first pulses, which are derived from certain pulse flanks of the jitter-associated digital signal, and second pulses of a jitterfree reference clock pulse, which are derived from the bit repetition frequency of the jitter-associated digital signal, are subjected to a phase comparison. A reference clock pulse is generated with a pulse-repetition frequency $nf_B = f_T$ corresponding to a multiple n of the bit repetition frequency $f_B$ of the digital signal and each bit period with a duration $T_B = 1/nf_B$ is divided into n partial periods each having a duration $t = T_B/n = 1/nf_B$. The ramp generator (5) is started upon the application of a release signal once in each bit clock period p partial periods after the end of that partial period in which appears the predetermined pulse flank of the digital signal (DS), where $p = 0, 1, 2, \ldots < n$. The ramp length of the sawtooth signal (S3) is slightly longer than one partial period (about 1.5 partial periods). The sampling pulse (S4) is delayed with respect to the predetermined pulse flank of the digital signal (DS) by $p+1$ partial periods. A coarse phase value is determined by the ordinal value of that partial period in which the predetermined pulse flank appears and after the passage of p partial periods the release signal is applied to the ramp generator (5). An alternating component of the sampled and held ramp signal and the coarse phase value are added to yield the measurement of the jitter modulation.

6 Claims, 3 Drawing Sheets

METHOD OF AND CIRCUIT FOR THE MEASUREMENT OF JITTER MODULATION OF ZERO-RELATED DIGITAL SIGNALS

FIELD OF THE INVENTION

My present invention relates to a method of measuring the jitter modulation of zero-related digital signals and, more particularly, to a method of measuring the jitter modulation of a digital signal in which first pulses which are derived from certain pulse flanks of a jitter-associated digital signal and second pulses of a jitter-free reference clock pulse are subjected to phase comparison.

BACKGROUND OF THE INVENTION

It is known to measure the jitter modulation of a digital signal by a phase comparison of first pulses derived from certain pulse flanks of a jitter-associated digital signal and second pulses of a jitter-free reference clock which are derived from the bit repetition frequency of the jitter-associated digital signal.

One pulse starts a linearly rising ramp generator while the other pulse determines sampling points of the ramp signal and the sampled values of the ramp signal are held. An alternating component of the sampled and held ramp signal is proportional to the jitter-modulation and a direct component of the sampled and held ramp signal establishes a setting value for the generation of the jitter-free reference frequency.

Methods and circuits utilizing the above-described principles are utilized in phase modulation and demodulation with respect to phase meters which are also used in the jitter-measurement and technology for digital transmission purposes (see CCITT 0.171 and definitions).

Jitter measurements are effected generally on binary signals, i.e. signals with a substantially rectangular wave form with respect to time.

For the recovery (demodulation) of the phase-time function $\phi(t)$ at the instantaneous positions of the flanks, basically two types of phase comparators are used.

Phase comparators of a first type convert the digital signal containing the phase-time function $\phi(t)$ with the aid of digital circuit units with the assistance of a jitter-free reference clock signal of identical bit frequency to a pulse duration modulated signal from which the desired phase-time function $\phi(t)$ is recovered by low-pass filtering.

Such phase meters are described by Tietze Schenk, HALBLEITER-SCHALTUNGSTECHNIK Volume 7, 1985, Springer Verlag, Section 26.4.3., pages 824 to 827. Phase comparators of a second type convert the phase difference between the phase-time function $\phi(t)$ containing digital signal and a jitter-free reference clock signal of identical bit frequency with the aid of a sampling phase comparator into a pulse-amplitude modulated (PAM) signal which gives the phase-time function directly. In this case, a subsequent low pass filtering is not mandatory.

Phase comparators of this second type operate generally by utilizing the ramp of a sawtooth signal of the reference frequency which is sampled by a pulse derived from the digital signal to be measured. The sequence of the resulting sampling values or scanning values provides the phase-time function $\phi(t)$.

An example of a phase comparator which functions generally in accordance with the second type of comparator, although using a sinusoidal reference signal, is found in Tietze Schenk, OP.CIT. Section 26.4.3., pages 819 to 822.

Phase comparators of the second type have indeed a good linearity, although they have a narrow dynamic range. The latter is generally significantly below $\pm\pi$. With higher bit frequencies, the dynamic range can be below $\pm(\pi/2)$. If larger measuring ranges are desired, greater ramp lengths are necessary which, however, give rise to an attenuation of the flank density of the digital signal. A process of this type can be carried out only with difficulty for zero-related digital signals.

Phase comparators of this second type do have, however, the significant advantage that they are suitable for directly operating on zero-related digital signals, since the detected phase (or an equivalent voltage value) can be stored until the arrival of the next bit flank even when these bit flanks are not equidistant.

They also have the further important advantage that they can measure the peak values of the generated PAM signal directly so that a theoretically maximum measuring band width can be realized.

A further important advantage of the phase comparator of the second type is that in the peak-value measurement of the PAM signal (without low-pass filtering), no pattern-dependent additional measurement error can arise.

OBJECTS OF THE INVENTION

It is the principal object of the present invention to provide a jitter-measurement system utilizing the principles of the second type, but wherein drawbacks of earlier systems are avoided.

Another object of the invention is to provide a phase comparator process for measurement of jitter-modulation which can operate directly on varying information-carrying digital signals, which can convert the phase directly into a PAM voltage and which basically is not limited in dynamic range or, in any event, has fewer limitations with respect to dynamic range than earlier processes of the second type.

It is also an object of the present invention to provide an improved circuit for carrying out the improved process.

SUMMARY OF THE INVENTION

These objects and others which will become apparent hereinafter are attained, in accordance with the present invention, in a process for measuring the jitter modulation of a digital pulse signal in which first pulses, which are derived from certain pulse flanks of the jitter-associated digital signal, are compared in phase with second pulses of a jitter-free reference clock derived from the bit frequency of the jitter associated digital signal, whereby one pulse starts a linearly rising ramp generator and the other pulse determines sampling points of the ramp signal. Using sampling-and-hold principles, the sampled values of the ramp signal are held and an alternating component of the sampled and held ramp signal can be obtained and is proportional to the jitter modulation while a direct component of the sampled and held ramp signal establishes a setting value or set point for the generation of the jitter-free reference frequency.

According to the present invention, the reference clock pulses are generated with a pulse-repetition frequency $nf_B=f_T$ corresponding to a multiple of the bit frequency $f_B$ of the original digital signal (DS) and each bit clock period with a duration $T=1/f_B=T_B$ is divided into n partial periods, each having a duration $t=T_B/n=1/nf_B$. The ramp generator is started upon the application of a release signal ($S_F$) or triggering signal once in each of these bit clock periods.

The ramp generator is started p partial periods after the end of that partial period in which appears the predetermined or certain pulse flank of the digital signal (DS)(where $p=0, 1, 2 ... < n$ or $P=0, 1, 2, 3 ..., n-1$).

The ramp length of the sawtooth signal is slightly larger than one partial period (e.g. 1.1 to 1.5 partial periods) and preferably is about 1.5 partial periods.

The sample pulse is delayed with respect to the predetermined pulse flank of the digital signal by p+1 partial periods. A coarse phase value is determined by the ordinal value of that partial period in which the predetermined pulse flank appears and after the lapse of p partial periods, the release signal is applied to the ramp generator. An alternating component of the sampled and held ramp signal and the coarse phase value are added to give the measured value of the jitter-modulation.

According to another aspect of the invention, the circuit arrangement for carrying out the process can include a coarse-value measurement unit which, determines in each bit period, that partial period in which the predetermined pulse flank of the digital signal falls and which from an ordinal number of this partial period, generates a coarse phase value and, upon the termination thereof and p further partial periods, generates a trigger signal which is applied to a ramp generator. The ramp generator is started only once in each bit period t at the beginning of a partial period and upon application of that trigger signal.

The ramp duration of a sawtooth output signal is only limitedly (10 to 50%) larger than a partial period duration t.

The sampling pulse is delayed with respect to the predetermined pulse flank of the digital by p+1 partial periods and a summer or adder is provided which combines the output value of the sample-and-hold circuit and the coarse phase value to the measured value of the jitter modulation.

According to another feature of the invention, a flash analog/digital (A/D) converter is provided to generate a digital fine value of the phase in place of the sample-and-hold circuit.

The coarse phase value measuring unit for generating digital coarse phase values can include a read memory (ROM) clocked with the sampling pulse and connected as an adding or summing circuit. For each measured coarse value change and for each possible prior coarse value, a new digital coarse value is contained therein and is applied via a D/A converter to a summing or adding circuit.

The invention has the advantages that it can operate in a completely pattern-independent manner, that it can operate directly on zero-related digital signals, that it provides jitter measurement without filtration and thus is especially reliable and free from error which may be introduced by filtration, that it can be used even where filtration (according to CCITT) may be required or desirable and it can be used for a wide variety of bit sequence frequencies.

BRIEF DESCRIPTION OF THE DRAWING

The above objects, features and advantages of our invention will become more readily apparent from the following description, reference being made to the accompanying drawing in which.

SPECIFIC DESCRIPTION

Figure 1:
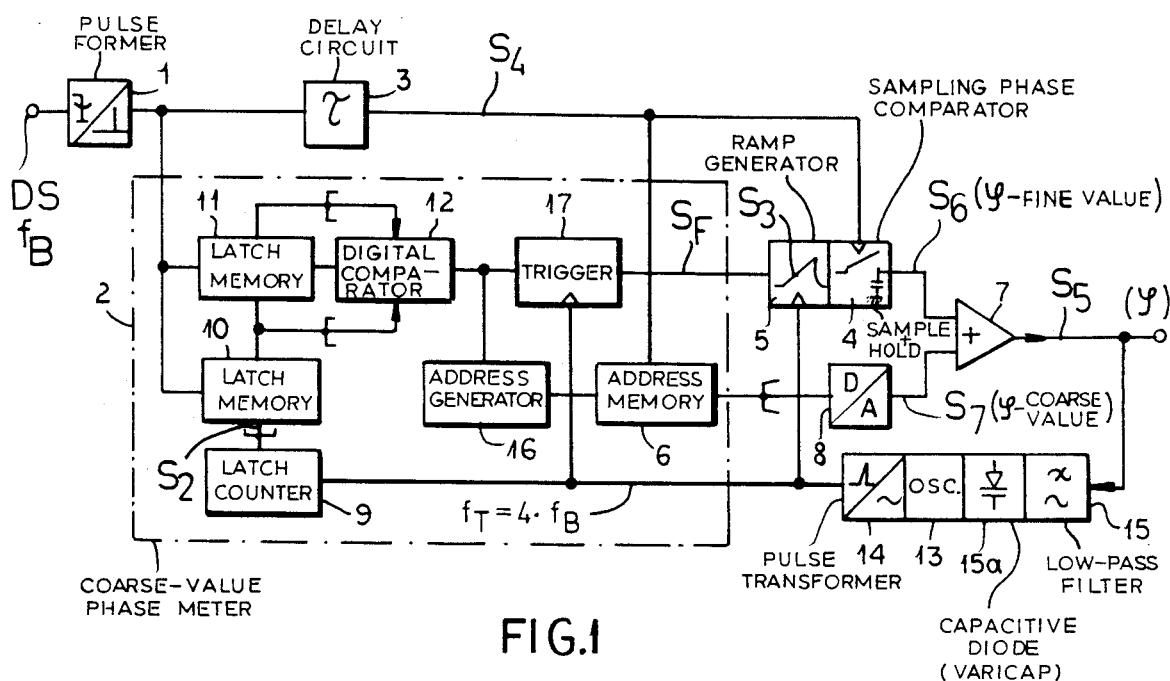
FIG. 1 is a block circuit diagram of a first embodiment of the invention.
Figure 2:
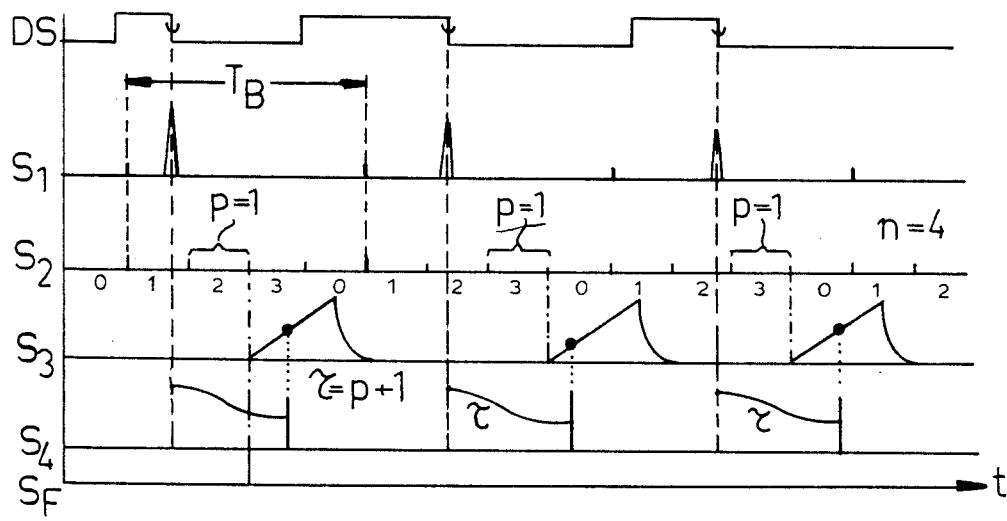
FIG. 2 is a pulse-timing diagram illustrating principles of the invention.

The circuit shown in FIG. 1 some of whose signals are displayed in FIG. 2, converts the falling flank (as the predetermined or certain flank) of a digital signal DS from a pulse former 1 into spike pulses $S_1$. The spike pulses $S_1$ are applied to an input of a coarse value phase meter 2. These spike pulses are also applied to the input of a delay network or circuit 3.

The output signal $S_4$ of the delay network is applied, on the one hand, to the control input of a sampling phase comparator supplying a fine-phase value at an output and constituted of a sample-and-hold circuit 4 and a ramp generator 5. The ramp generator supplies a ramp signal to the sample-and-hold circuit 4.

The output signal $S_4$ is applied on the other hand to an address memory or register 6 as a memory transfer signal. This address register 6 forms part of the coarse-value phase meter 2 and has its output applied as the input to a digital/analog converter 8.

Since an output signal representing a fine value of the phase appears as the output $S_6$ of the sample-and-hold circuit and an output $S_7$ representing a coarse value of the phase appears at the output of the D/A converter 8, these output signals can be combined by applying them to a summing circuit 7 which outputs a measurement signal $S_5$ proportional to the jitter modulation.

The coarse-value phase meter 2 contains a latch counter 9 whose parallel output is connected with the parallel inputs of a first latch memory 10. The parallel output of the first latch memory 10 is connected with the parallel inputs of a second latch memory 11. Both latch memories receive a memory transfer signal from the output of the pulse former 1.

The outputs of the first and second latch memories or registers 10 or 11 are applied to respective inputs of a digital comparator 12.

A controllable-frequency oscillator 13 supplies a jitter-free signal of the frequency $f_T$ to a pulse transformer 14. The latter frequency is n=4 times greater than the bit frequency $f_B$ of the digital signal DS ($f_T=4f_B$) The output of the pulse transformer 14 is applied to a stepping input to the latch counter 9 and to a trigger input of the ramp generator 5.

The measured signal from the output of the summing circuit 7 can be fed via a low-pass filter 15 to a control input of the oscillator 13, e.g. via a capacitive diode or VARICAP 15a to form a phase-locked loop which holds the phase of the oscillator 13 at its output frequency $f_T$ jitter-free at a mean constant value.

In the coarse-value phase meter 2, upon each detection of a spike pulse $S_1$, the instantaneous state of the latch counter 9 is transferred into the first latch storage 10 and simultaneously the instantaneous count, which is dependent upon the position of the respective spike pulse and represents the previously occurring spike pulses, is transferred to the second latch memory 11.

The comparator 12 forms a difference between the instantaneous and prior states of the latch counter 9 and provides an output representing this difference to an address generator 16 on the one hand and to a trigger switch 17 on the other. The latter passes the signal received from the comparator 12 when it is triggered by an enable signal received from the pulse former 14 with a frequency $4f_B$ which is n times the bit frequency $f_B$ and determines, corresponding to FIG. 3 by the partial period in which the spike pulse $S_1$ arose, the partial period at the beginning of which the ramp generator 5 is started.

The address generator 16 contains addresses supplied by the digital comparator 12 corresponding to the differences between the phase differences of the bit clock and successive jitter-related needle pulses $S_1$ and representing coarse digital phase values of the respective pulse of the digital signal DS since it appears at the input of the summing circuit 7 around an analog coarse phase value $S_7$ via the delayed clocking of the intermediate memory 6 by the output signal $S_4$ of the delay circuit 3 and the digital/analog converter.

If the digital signal has no jitter or only a low-level jitter, the sampling results in the latching counter 9 having continuously the same counter state. As can be seen from FIG. 3, under these circumstances, neither the address nor the start of the ramp is altered. This state is represented at 0 at the right-hand side in FIG. 3. The output signal $S_5$ then corresponds to the value of the signal $S_6$ corresponding to the fine-phase value outputted by the sample-and-hold circuit 4 because the comparator 12 in this case does not determine any difference between the counter states and the address generator supplies a coarse phase value $S_7$ equal to zero.

Upon the development of an instantaneous jitter, the comparator 12 determines positive or negative differences of the values 1, 2 or 3 which, after their conversion in the address generator 16, give rise to digital coarse phase values differing from zero.

Figure 3:
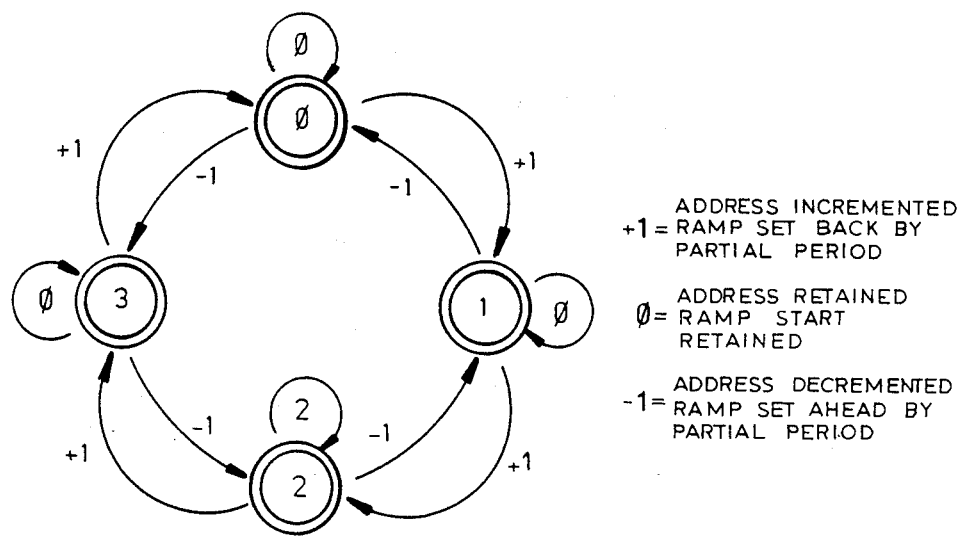
FIG. 3 is a state diagram illustrating the addresses and memory relationships for the circuit of FIG. 1 and the pulse-timing diagram of FIG. 2.

The analog signals $S_7$ resulting therefrom are added in the summing circuit 7 to the analog output signal $S_6$ from the sample-and-hold circuit 4 to form the output signal $S_5$ as a measurement of the jitter. In this case, the ramp start as shown in FIG. 3 is advanced or retarded by 1, 2 or 3 partial periods t. FIG. 3, therefore, shows in a simplified form differences which might be generated by a digital comparator between the latching memory contents from the value 1.

Figure 4:
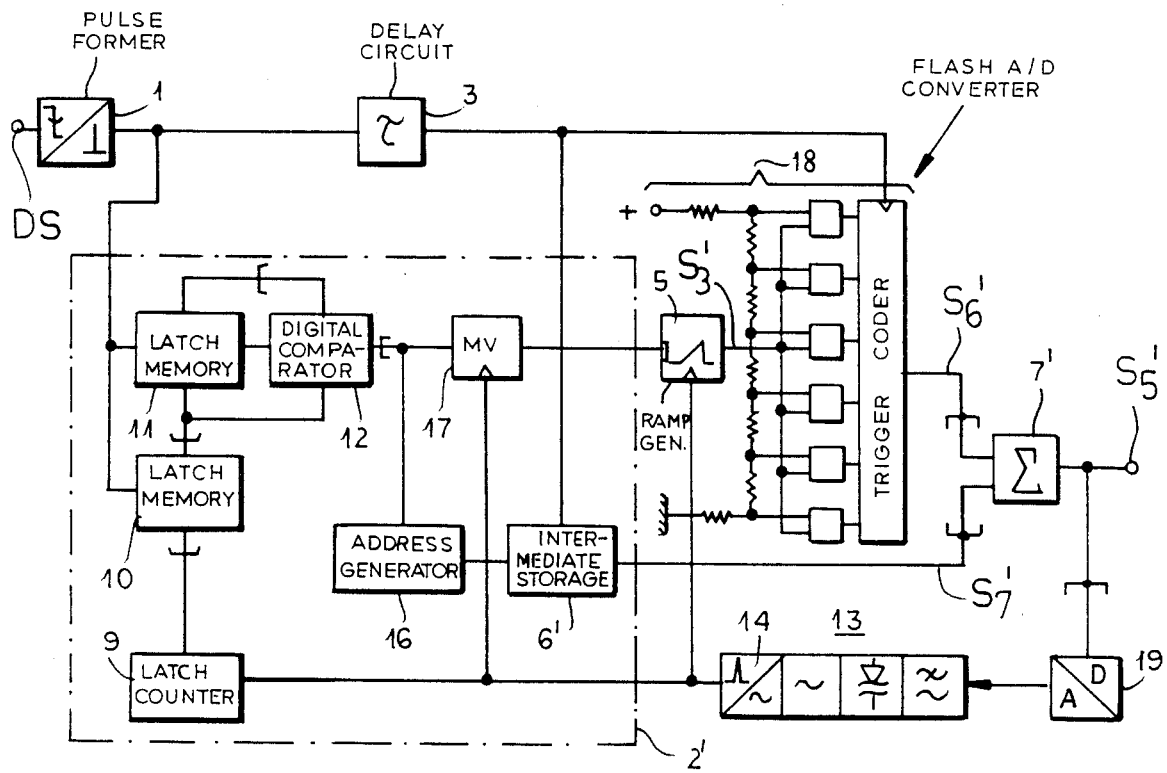
FIG. 4 is a block diagram of a second embodiment.
Figure 5:
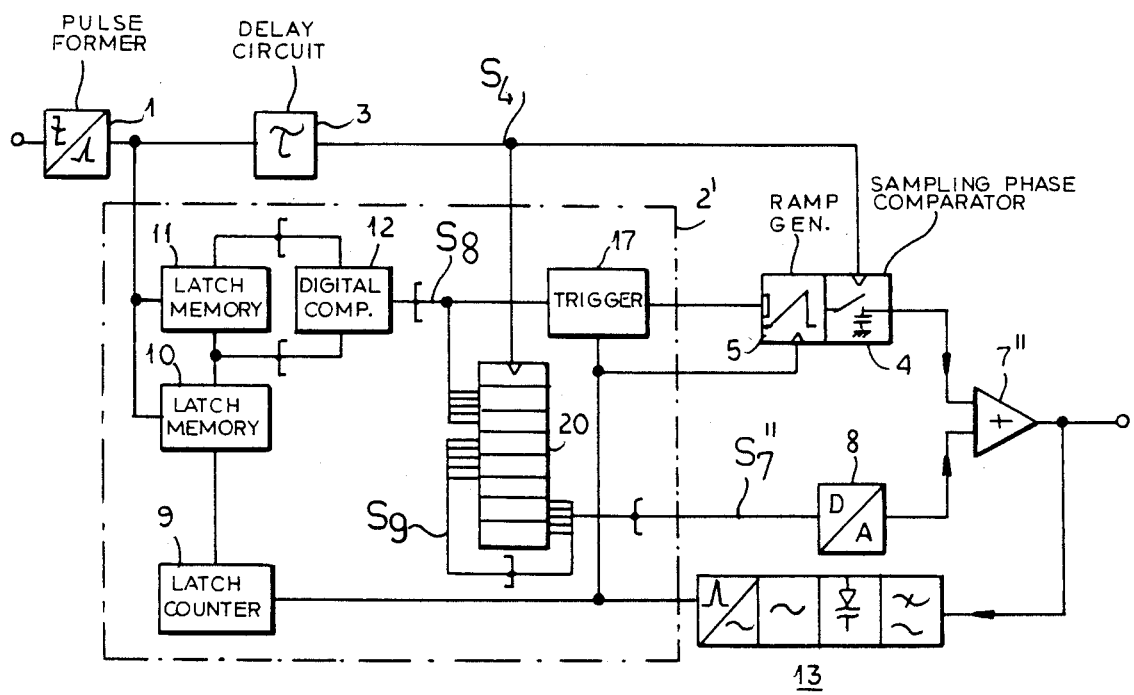
FIG. 5 is a block diagram of a third embodiment.

A second embodiment of the invention has been illustrated in FIG. 4 and in this FIGURE, the coarse phase measuring unit has been represented at 2' and corresponds to that shown at 2 in FIG. 1. The input signal is here applied at DS to the pulse former 1 and from the latter to the delay circuit 3 and to the setting inputs of the latch memories 10 and 11. The latter are connected to the digital comparator 12, and which output prepares the trigger unit 17 which is triggered by the input from the pulse transformer 14. The latch counter 9 and the address generator 16 described in connection with FIG. 1 are provided in this circuit as well.

In the embodiment of FIG. 4, however, the output from the ramp generator 5, which has a sawtooth wave form, is represented at $S_{3'}$.

In this embodiment, in place of the sample-and-hold circuit 4 of FIG. 1, a flash analog/digital converter 18 is provided to sample the ramp voltage $S_{3'}$ and supply at $S_{6'}$ a digital fine-phase value to the digital summing circuit 7'.

The digital summing circuit 7' thus adds the digital output signal $S_{6'}$ of the flash AD converter and the digital output signal $S_{7'}$ from the intermediate storage 6' of the coarse value measurement unit 2' to provide a digital jitter-measurement signal $S_{5'}$.

A digital/analog converter 18 forms an analog control or feedback signal for the oscillator circuitry 13 which operates similarly to the circuit correspondingly illustrated in FIG. 1.

In the embodiment of FIG. 1, a read memory 20 or ROM is provided as an adder circuit. This read memory contains all addresses and the associated new latch states for each new or corrected addresses. With the aid of this type of memory addition circuit, in addition, modified control signals can be generated. In this embodiment, therefore, the coarse value digital signals are subjected to digital/analog conversion in the converter 8 before being supplied to the adder 7''.

Figure 6:
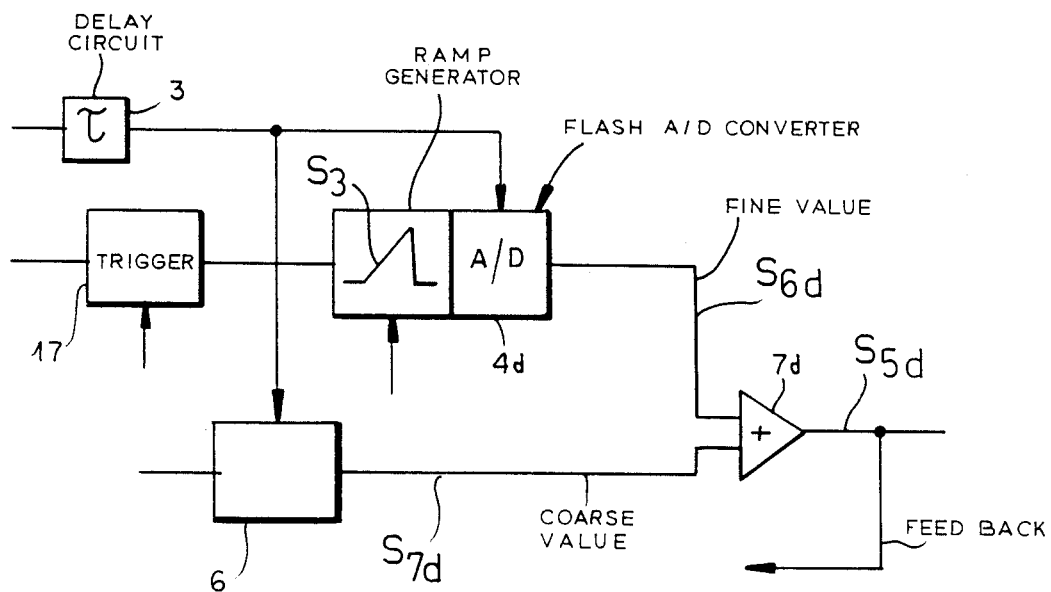
FIG. 6 is a fragmentary view illustrating the circuit of FIG. 1 provided with a flash analog/digital converter of the type illustrated in FIG. 4 in block form.

FIG. 6 shows a modification of the embodiment of FIG. 1 in which the sampling phase comparator 4 thereof is replaced by a flash analog/digital converter $4d$ which outputs the fine value signal $S_6D$ to the summing circuit $7d$. The coarse value $S_7D$ derives from the intermediate storage 6. The feedback path from the output signal $S_5D$ can be effected via a digital analog converter as in FIG. 4.

I claim:

1. In a process for measuring a jitter modulation of a digital signal (DS) in which first pulses, which are derived from certain pulse flanks of the jitter-associated digital signal, and second pulses of a jitter free reference clock pulse, which are derived from a bit-clock frequency of the jitter-associated digital signal, are subjected to a phase comparison, whereby one of said first and second pulses starts a linearly rising ramp generator, the other of said first and second pulses determines sampling points of the ramp signal, and sampled valued of the ramp signal are held to form a sampled and held ramp signal, and whereby an alternating component of the sampled and held ramp signal is proportional to the jitter modulation and a direct component of the sampled and held ramp signal establishes a setting value for the generation of the jitter free reference frequency, the improvement which comprises the combination of the following steps:

(a) generating the reference clock pulse with a pulse-repetition frequency $nf_B = f_T$ corresponding to a multiple n of the bit clock frequency $f_B$ where n is an integer and dividing each bit clock period with a duration $T_B = 1/nf_B$ is divided into n partial periods each having a duration $t = T_B/n = 1/nf_B$;

(b) starting the ramp generator (5) upon the application of a release signal once in each bit clock period and p partial periods after the end of that partial period in which appears the predetermined pulse flank of the digital signal (DS), where p = 0, 1, 2, . . . < n;

(c) forming the ramp length of the sawtooth signal (S3) to be slightly longer than one partial period;

(d) forming a sampling pulse (S4) which is delayed with respect to the predetermined pulse flank of the digital signal (DS) by p+1 partial periods;

(e) determining a coarse phase value by an ordinal value of that partial period in which the predetermined pulse flank appears and after the passage of p partial periods applying the release signal is applied to the ramp generator (5); and (f) adding an alternating component of the sampled and held ramp signal and the coarse phase value to form the measurement of the jitter modulation.

2. The method defined in claim 1 wherein the ramp length in step (c) is selected to be about 1.5 of said partial periods.

3. A circuit for measuring jitter modulation of a digital signal (DS) which comprises:

a pulse former receiving said digital signal (DS) and producing a pulse train ($S_1$) of spikes synchronous with said digital signal (DS) and having bit repetition frequency $f_B$;

means for generating clock pulses of a pulse repetition frequency $n \cdot f_B$ where n is an integer and the pulse repetition frequency is a multiple of the bit repetition frequency $f_B$;

means responsive to said clock pulses for subdividing each period T of the bit repetition frequency $f_B$, where $T = 1/f_B$, into n partial periods each of a duration $t_i = T/n = 1/nf_B$;

coarse value measuring means for determining a coarse phase value ($S_7$) from an ordinal value of the partial period in which a predetermined pulse flank of said pulse train falls;

a delay network receiving said pulse train and outputting delayed signals corresponding thereto;

fine value measuring means receiving said delayed signals and outputting a fine phase value ($S_6$); and an adding circuit receiving said coarse phase value ($S_7$) and said fine phase value ($S_6$) and outputting a signal ($S_5$) representing a measurement of jitter.

4. The circuit for measuring jitter modulation defined in claim 3 wherein said fine value measuring means includes a ramp generator outputting a ramp of a sawtooth signal of a duration longer by 10% to 50% than a duration t of said partial periods, means for generating a release signal ($S_F$) for said ramp generator only once during each bit period T and following the partial period in which said predetermined pulse flank of said pulse train falls and p partial periods thereafter, p=1, 2, 3 ..., n−1, said delay network generating a sampling signal ($S_4$) delayed with respect to the predetermined flank by p+1 partial periods, and a sample-and-hold circuit (4) connected to said ramp generator and outputting said fine phase value ($S_6$).

5. The circuit for measuring jitter modulation defined in claim 3 wherein said fine value measuring means includes a flash analog-to-digital converter.

6. The circuit for measuring jitter modulation defined in claim 3 wherein said coarse value measuring means generates a digital coarse phase value ($S_7''$) and includes a read memory (20) clocked by a sampling signal ($S_4$) delayed with respect to the predetermined flank and outputted by said delay network, said read memory being connected as a summing circuit and containing a new digital coarse phase value ($S_7''$) for each measured coarse value change ($S_8$) and for each possible previous coarse value ($S_9$), a digital-to-analog converter connecting said read memory to said adding circuit.

* * * * *